(12) United States Patent
Mantani et al.

(10) Patent No.: US 10,440,866 B2
(45) Date of Patent: Oct. 8, 2019

(54) SYSTEM FOR MANUFACTURING ASSEMBLY BOARD AND METHOD FOR INSTALLING UNDERSUPPORTING DEVICE OF THE SYSTEM

(71) Applicant: PANASONIC INTELLECTUAL PROPERTY MANAGEMENT CO., LTD., Osaka (JP)

(72) Inventors: Masayuki Mantani, Yamanashi (JP); Takaaki Sakaue, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 107 days.

(21) Appl. No.: 15/375,625

(22) Filed: Dec. 12, 2016

(65) Prior Publication Data

US 2017/0245406 A1 Aug. 24, 2017

(30) Foreign Application Priority Data

Feb. 18, 2016 (JP) ................................. 2016-028458
Feb. 18, 2016 (JP) ................................. 2016-028460

(51) Int. Cl.
*H05K 13/00* (2006.01)
*B23P 19/04* (2006.01)
(Continued)

(52) U.S. Cl.
CPC .......... *H05K 13/0069* (2013.01); *B23P 19/04* (2013.01); *B25B 11/002* (2013.01);
(Continued)

(58) Field of Classification Search
CPC ... H05K 2203/0147; H05K 2203/0152; H05K 2203/0165; H05K 2203/0173;
(Continued)

(56) References Cited

U.S. PATENT DOCUMENTS

2013/0020379 A1* 1/2013 Kim ..................... H05K 3/1233
228/256
2015/0075721 A1 3/2015 Mantani et al.
(Continued)

FOREIGN PATENT DOCUMENTS

JP H03-289198 A 12/1991
JP 07186362 A * 7/1995 .............. B41F 15/08
(Continued)

*Primary Examiner* — Matthew P Travers
(74) *Attorney, Agent, or Firm* — Pearne & Gordon LLP

(57) ABSTRACT

System for manufacturing an assembly board includes an undersupporting device, a transporter, an undersupporting-device installer attachable to and detachable from the undersupporting device, a board processor, a carry-in side delivering unit having different first and second receiving positions, a board supplier configured to supply the board to the first receiving position, and an undersupporting-device supplier configured to supply the undersupporting device to the second receiving position. The carry-in side delivering unit delivers the undersupporting device to the transporter, which transports the undersupporting device to a working position. The undersupporting-device is fixed to the undersupporting-device installer. The carry-in side delivering unit delivers the board to the transporter, which transports the board to the working position.

12 Claims, 17 Drawing Sheets

(51) Int. Cl.
*B41F 15/26* (2006.01)
*B25B 11/00* (2006.01)
*B41F 15/18* (2006.01)
*H05K 3/12* (2006.01)
*H05K 13/04* (2006.01)

(52) U.S. Cl.
CPC ............ *B25B 11/005* (2013.01); *B41F 15/18* (2013.01); *B41F 15/26* (2013.01); *H05K 3/1216* (2013.01); *H05K 13/04* (2013.01); *B65G 2201/0261* (2013.01); *H05K 2203/0165* (2013.01)

(58) Field of Classification Search
CPC ....... H05K 2203/1509; H05K 13/0069; H05K 13/046; H05K 13/0469; H05K 3/1216; H05K 13/04; H05K 13/0465; H05K 3/30–301; B41F 15/0818; B41F 15/0881; B41F 15/18; B41F 15/26; Y10T 29/53196; Y10T 29/53191; Y10T 29/53265; Y10T 29/49829; Y10T 29/53313; Y10T 29/53365; Y10T 29/5337; Y10T 29/53539–53548; Y10T 29/49002; Y10T 29/49885; Y10T 29/49998; Y10T 29/53174–53183; B23P 21/004; B23P 19/04; B25B 11/002; B25B 11/005

See application file for complete search history.

(56) References Cited

U.S. PATENT DOCUMENTS

2015/0321464 A1  11/2015  Horie et al.
2016/0007512 A1* 1/2016  Higashi ............. H05K 13/0061
                                              29/832

FOREIGN PATENT DOCUMENTS

| JP | 2000-124690 A | 4/2000 |
| JP | 2001-210999 A | 8/2001 |
| JP | 3499759 B2 | 2/2004 |
| JP | 2008-166583 A | 7/2008 |
| JP | 2014-165237 A | 9/2014 |
| JP | 2015-083364 A | 4/2015 |
| JP | 2015-214089 A | 12/2015 |

* cited by examiner

SYSTEM FOR MANUFACTURING ASSEMBLY BOARD AND METHOD FOR INSTALLING UNDERSUPPORTING DEVICE OF THE SYSTEM

BACKGROUND

1. Technical Field

The present, disclosure relates to an assembly board manufacturing system which performs predetermined processing, such as screen printing or mounting components with respect to a board, and an installation method of an undersupporting device in the assembly board manufacturing system.

2. Description of the Related Art

In the related art, in an assembly board manufacturing system which performs predetermined processing, such as screen printing or mounting components with respect to a board, in order to stably perform the processing to the board, a lower surface of the board which becomes a processing target is supported.

An undersupporting device which is used in supporting the board has a shape or a size that varies in accordance with the size of the board or a state (for example, a disposition state of components which have already been mounted on the lower surface of the board) of the lower surface, and when changing the type of the board to be produced, preparatory work of exchanging the undersupporting device in accordance with the board that becomes the processing target is required.

Most of the preparatory work of exchanging the undersupporting device is performed manually, and causes an increase in the number of processes.

Therefore, a system which prepares a plurality of undersupporting devices which correspond to the type of the board in advance, and automatically changes the undersupporting devices in accordance with the board which becomes the processing target, is known.

For example, in Japanese Patent No. 3499759, a system which supplies a carrier that can bold an undersupporting device into a transporter, and supplies and collects the undersupporting device through the supplied carrier, is disclosed.

SUMMARY

A system for manufacturing an assembly board includes an undersupporting device, a transporter configured to transport a board and the undersupporting device, an undersupporting-device installer provided below the transporter and being attachable to and detachable from the undersupporting device, a board processor configured to perform a predetermined processing to an upper surface of the board, a carry-in side delivering unit, having first and second receiving positions different from each other, a board supplier configured to supply the board to the first receiving position, and an undersupporting-device supplier configured to supply the undersupporting device to the second receiving position. The carry-in side delivering unit delivers, to the transporter, the undersupporting device supplied to the second receiving position. The transporter transports, to a working position, the undersupporting device delivered from the carry-in side delivering unit. The undersupporting-device installer fixes, to the undersupporting-device installer, the undersupporting device transported to the working position. The carry-in side delivering unit delivers, to the transporter, the board supplied to the first receiving position. The transporter transports, to the working position, the board delivered from the carry-in side delivering unit. The undersupporting device supports a lower surface of the board transported to the working position. The board processor performs the predetermined processing to the upper surface of the board while the undersupporting device is fixed to the undersupporting-device installer and supports the lower surface of the board.

The system can install the undersupporting device without interrupting the supplying of the board.

DETAILED DESCRIPTION

In a device described in Japanese Patent No. 3499759, a carrier is seat to a transporter by a path which is completely the same as that of a board, therefore, in order to automatically install an undersupporting device to be automatically installed by supplying into the transporter, it is necessary to temporarily stop the supply of a board by a board supplier for automatic installation. Therefore, processing work with respect to the board is interrupted, and there is a concern that productivity of the board is lowered.

Figure 1:
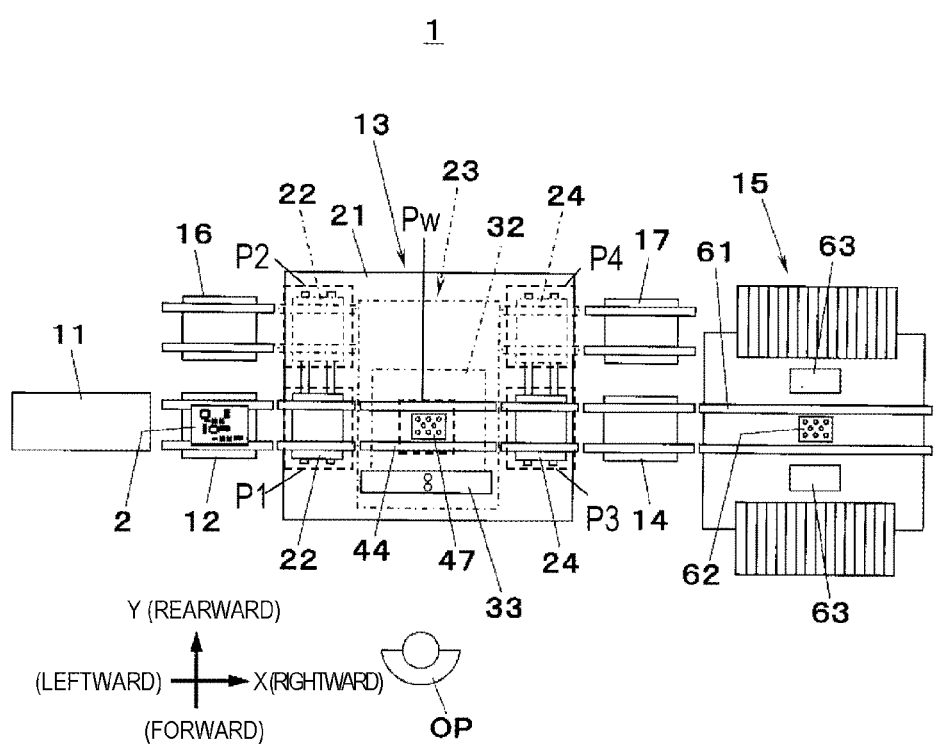
FIG. 1 is a plan view illustrating a schematic configuration of an assembly board manufacturing system in an embodiment.

Hereinafter, an embodiment of this disclosure will be described with reference to the drawings. FIG. 1 illustrates assembly board manufacturing system 1 in the embodiment. Assembly board manufacturing system 1 performs screen printing processing and mounting processing of a component with respect to board 2, manufactures an assembly board, and includes board supplier 11, carry-in side relay conveyor 12, screen printing device 13, carry-out side relay conveyor 14, component placement device 15, undersupporting-device supplier 16, and undersupporting-device collector 17. A flow of board 2 is in the direction from a left side to a right side when viewed from operator OP, and the direction is the X-axis direction. In addition, the forward-and-rearward direction when viewed from operator OP is considered as the Y-axis direction, and the upward-and-downward direction is considered as the Z-axis direction.

Board supplier 11 is provided on the most, upstream process side of assembly board manufacturing system 1, and continuously supplies board 2. Carry-in side relay conveyor 12 is provided on a downstream process side of board supplier 11, and transports board 2 supplied by board supplier 11 to screen printing device 13 on the downstream process side.

As illustrated in FIG. 1, screen printing device 13 is provided with carry-in side delivering unit 22, printing performer 23, and carry-out side delivering unit 24 on base 21. Printing performer 23 is provided at the center of base 21 and carry-in side delivering unit 22 is provided in a region (upstream process side of printing performer 23) on a left side of printing performer 23 on base 21. In addition, carry-out side delivering unit 24 is provided in a region (downstream process side of printing performer 23) on a right side of printing performer 23 on base 21.

In FIG. 1 carry-in side delivering unit 22 receives transport target supplied from the upstream process side at any of a plurality of receiving positions which are set to be aligned in the Y-axis direction, and delivers the received transport target to a transporter inlet on the left end side of printing performer 23 (specifically, transporter 44 which will be described later). In the embodiment, the receiving positions at which carry-in side delivering unit 22 receives the transport target are two positions, including receiving position P1 (illustrated by a broken line in FIG. 1) close to operator OP side, and receiving position P2 (illustrated by broken line in FIG. 1) far from operator OP side, and receiving position P1 matches the transporter inlet.

Board supplier 11 supplies board 2 to receiving position P1 via carry-in side relay conveyor 12. Therefore, in a case where carry-in side delivering unit 22 receives transport target (here, board 2) at receiving position P1, board 2 is positioned at the transporter inlet, while maintaining a state thereof. In other words, in the embodiment, board supplier 11 supplies board 2 which serves as a transport target to receiving position P1 among the plurality of receiving positions provided in carry-in side delivering unit 22.

Figure 2:
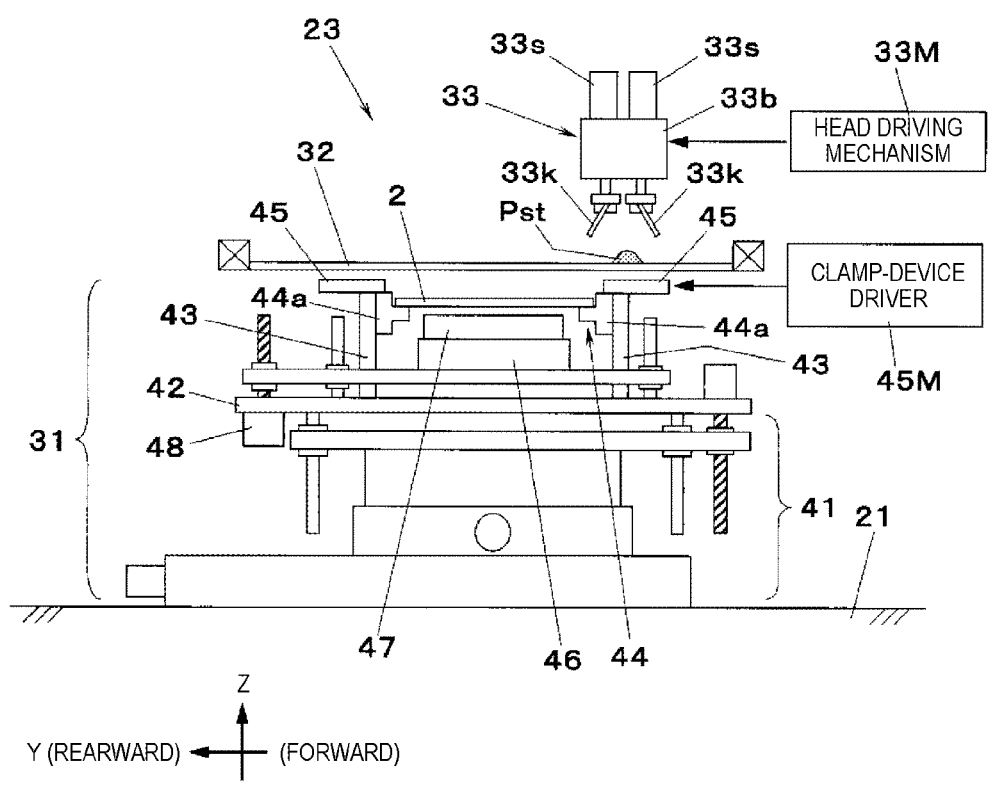
FIG. 2 is a side view of a screen printing device provided in the assembly board manufacturing system in the embodiment.

In FIG. 2, printing performer 23 is provided with board holding unit 31 provided on base 21, mask 32, and squeegee head 33. Board holding unit 31 is provided with XYZ rotation stage 41 provided on base 21; base part 42 which freely moves on a horizontal plane by XYZ rotation stage 41, moves to be raised and lowered, and rotates around the Z-axis; transporter 44 and one pair of clamp devices 45 which are attached to one pair of transporter support walls 43 provided in base part 42; undersupporting-device installer 46 which is provided below transporter 44; undersupporting device 47 which is installed to be freely attached to and detached from an upper surface of undersupporting-device installer 46; and an elevator mechanism 48 (undersupporting-device installer elevator mechanism) which reaises and lowers undersupporting-device installer 46 (that is, undersupporting device 47) with respect to base part 42. Mask 32 and squeegee head 33 configure a board processor which performs predetermined processing to the upper surface of board 2 of which the lower surface is supported by undersupporting device 47.

In FIG. 2, transporter 44 includes one pair of conveyors 44a which are installed to oppose each other in the Y-axis direction. One pair of clamp devices 45 are driven by clamp-device driver 45M, and are operated to approach or be separated from each other. Transporter 44 receives and transports the transport target, which is positioned at the transporter inlet (receiving position P1) by carry-in side delivering unit 22, positions the transport target to predetermined working position Pw, and carries out the transport target.

Figure 3:
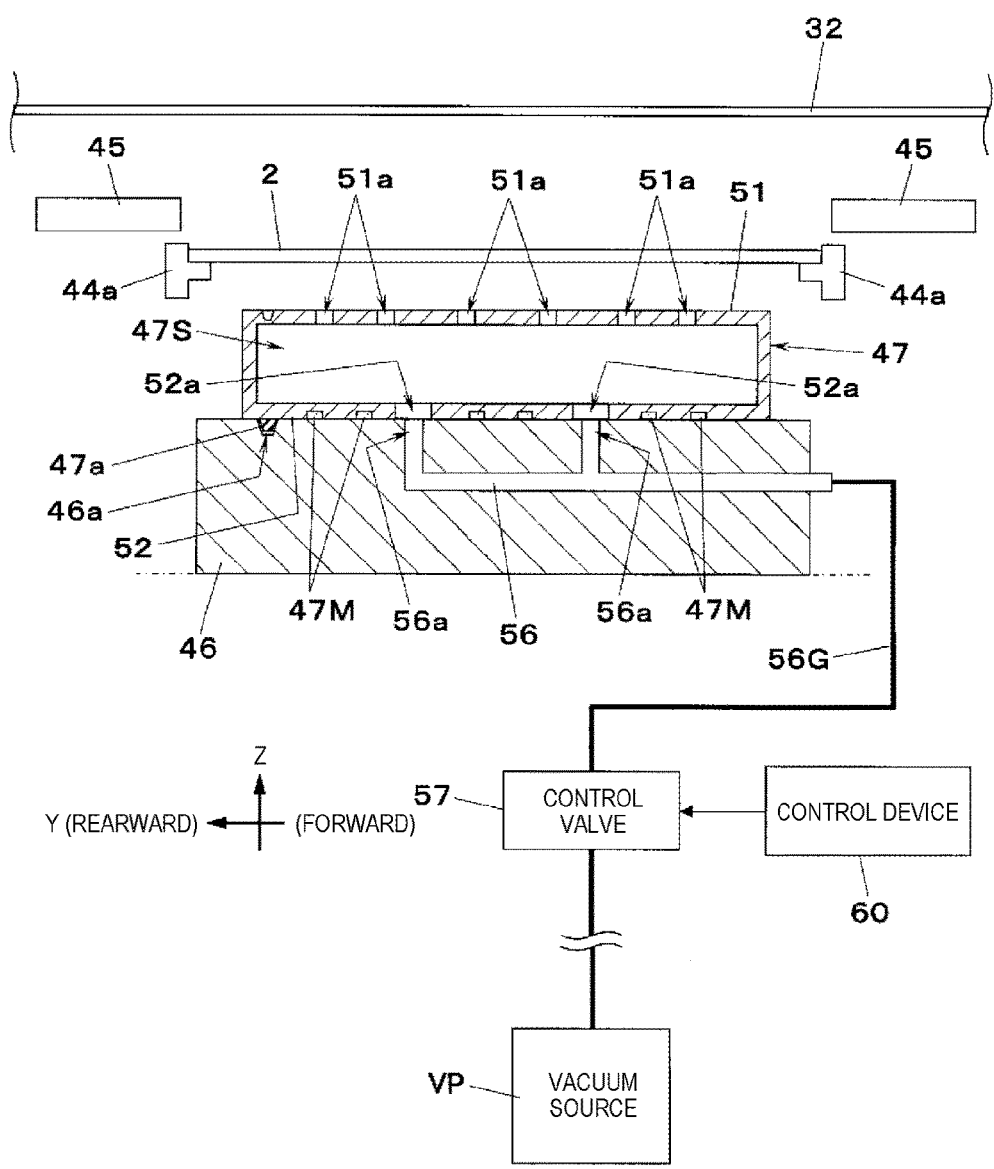
FIG. 3 is a side sectional view of the vicinity of an undersupporting device of the screen printing device provided in the assembly hoard manufacturing system in the embodiment.

As illustrated in FIGS. 2 and 3, mask 32 is held to be in a horizontal posture above board holding unit 31. Mask 32 is configured of for example, a metal plate-like device, and at the center thereof pattern openings (not illustrated) which correspond to each of plural electrodes (not illustrated) formed on the upper surface of board 2, are provided. Squeegee head 33 is configured to include two squeegees 33k which are provided to oppose each other in the Y-axis direction on squeegee base 33b which is driven by head driving mechanism 33M and moves in the Y-axis direction above mask 32; and two cylinders 33s which raise and lower each squeegee 33k with respect, to squeegee base 33b.

Figure 4:
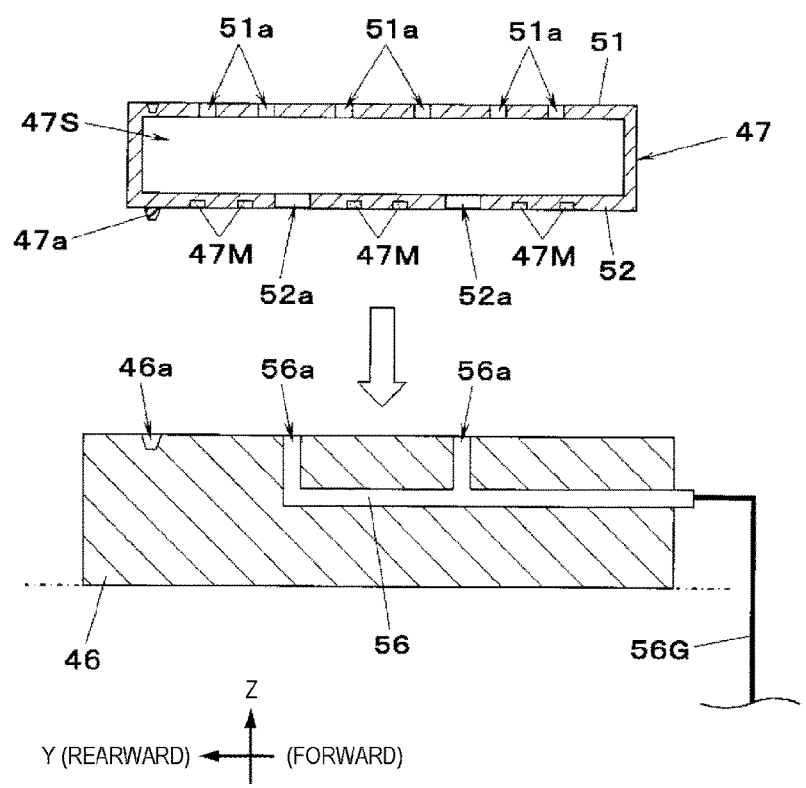
FIG. 4 is a side sectional view illustrating the undersupporting device of the screen printing device provided in the assembly board manufacturing system m the embodiment, together with an undersupporting-device installer.

Undersupporting device 47 is a hollow box-like device which has inner space 47S as illustrated in FIGS. 3 and 4, and is made of a magnetic material. Undersupporting device 47 is a device which supports the lower surface of board 2 that serves as a transport target positioned at working position Pw by transporter 44, and in the embodiment, undersupporting device 47 is configured to suction the lower surface while supporting the lower surface of board 2 positioned at working position Pw by transporter 44.

The upper surface of top board 51 of undersupporting device 47 is a surface which comes into contact with the lower surface of board 2, and is provided with a plurality of suction holes 51a which are open at the upper part thereof. The lower surface of bottom plate 52 of undersupporting device 47 is a surface which comes into contact with the upper surface of undersupporting-device installer 46, and is provided with a plurality of piping connection boles 52*a* which are open at the lower part, thereof. In FIGS. 3 and 4, a plurality of magnets (magnet 47M which are embedded to be exposed on the lower surface side, are provided in bottom plate 52 of undersupporting device 47. Meanwhile, a certain region including at least the upper surface of undersupporting-device installer 46 is configured of a magnetic material. Therefore, a magnetic force which pulls undersupporting device 47 and undersupporting-device installer 46 to each other acts therebetween, and undersupporting device 47 is fixed to undersupporting-device installer 46 by the magnetic force when undersupporting device 47 is installed on undersupporting-device installer 46.

As illustrated in FIG. 4, projection 47*a* which protrudes downward is provided on the lower surface of undersupporting device 47, and recess 46*a* having a shape that can be fitted to projection 47*a* is provided on the upper surface of undersupporting-device installer 46. Plural projections 47*a* and recesses 46*a* are respectively provided to be aligned in the X-axis direction (the direction perpendicular to a paper surface of FIG. 4), and as the plurality of projections 47*a* of undersupporting device 47 are fitted to the plurality of recesses 46*a* of undersupporting-device installer 46, undersupporting device 47 is disposed in undersupporting-device installer 46 in a state of being accurately positioned on undersupporting-device installer 46.

It is preferable that, projection 47*a* is conical, and in this manner, when undersupporting device 47 is installed above undersupporting-device installer 46, even when the center axis of each projection 47*a* is slightly shifted from the center axis of corresponding recess 46*a*, it is possible to install, undersupporting device 47 at an accurate position on undersupporting-device installer 46. In addition, here, projection 47*a* is provided on the lower surface of undersupporting device 47, and recess 46*a* is provided on the upper surface of undersupporting-device installer 46, but the recess may be provided on the lower surface of undersupporting device 47, and the projection may be provided on the upper surface of undersupporting-device installer 46. In other words, while the projection provided in any one of undersupporting device 47 and undersupporting-device installer 46, is fitted to the recess provided in the other one of undersupporting device 47 and undersupporting-device installer 46, undersupporting device 47 may be installed on undersupporting-device installer 46.

In FIGS. 3 and 4, suction piping 56 is formed on the inside of undersupporting-device installer 46, and outlet opening 56*a* of suction piping 56 is formed on the upper surface of undersupporting-device installer 46. When undersupporting device 47 is installed on undersupporting-device installer 46, outlet opening 56*a* of suction piping 56 matches piping connection hole 52*a* provided on bottom plate 52 of undersupporting device 47, and inner space 47S of undersupporting device 47 and suction piping 56 are connected to each other (FIG. 4).

In FIG. 3, suction piping 56 is linked to vacuum source VP through outer piping 56G which extends on the outside of undersupporting-device installer 46, and control valve 57 is interposed in outer piping 56G. When vacuum source VP suctions out the air through outer piping 56G and suction piping 56 while board 2 is in contact with undersupporting device 47, board 2 is suctioned to undersupporting device 47 by a suctioning force generated in suction hole 51*a*. Therefore, it is possible to adjust a holding force of board 2 by driving control valve 57 and adjusting the size of the suctioning force generated in suction hole 51*a*, and also it is possible to release the suctioned state of board 2 to under-supporting device 47 by driving control valve 57 and opening suction piping 56 to the atmosphere.

In FIG. 1, when carrying out the transport target, transporter 44 carries out the transport target from the transporter outlet on the right side, and carry-out side delivering unit 24 receives the transport target carried out from transporter 44 in a state of being moved to the transporter outlet. In addition, carry-out side delivering unit 24 carries out the transport target received from transporter 44, to the outside from any of the plurality of carry-out positions set to be aligned in the Y-axis direction. In the embodiment, the carry-out positions are two positions, including carry-out position P3 (illustrated by a broken line in FIG. 1) close to operator OP side, and carry-out position P4 (illustrated by broken in FIG. 1) far from operator OF side, and carry-out position P3 is also the transporter outlet. Therefore, when carry-out side delivering unit 24 receives the transport target at the transporter outlet, the transport target is positioned at carry-out position P3 while maintaining a state thereof.

Figure 5:
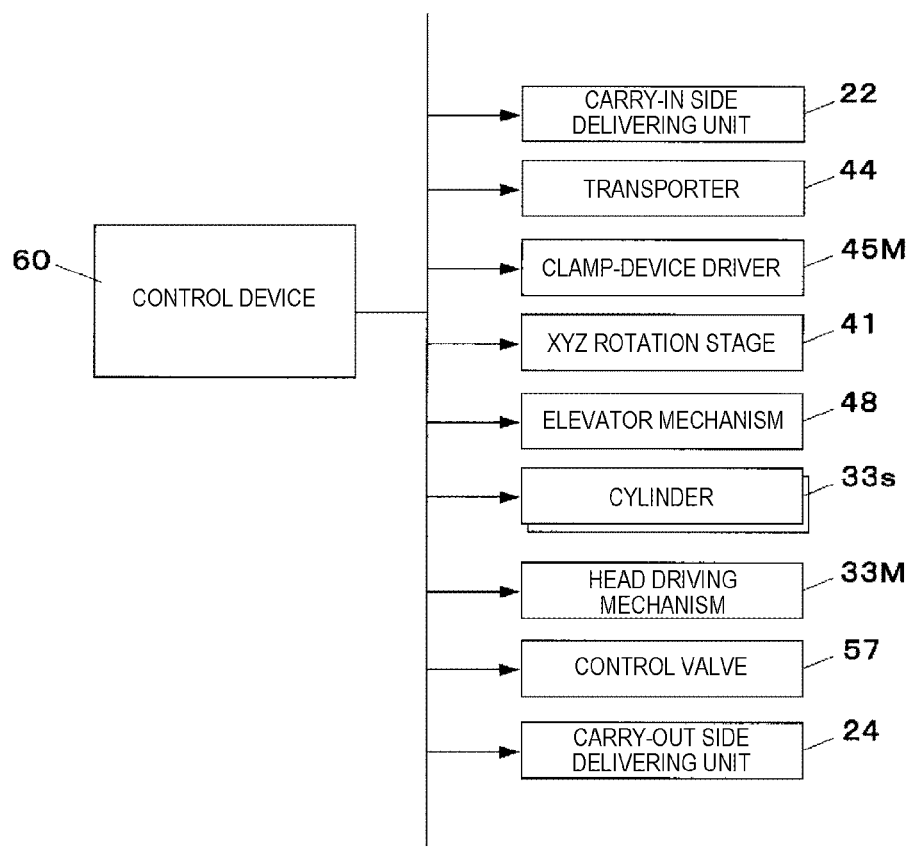
FIG. 5 is a block, diagram illustrating an operation system of the screen printing device provided in the assembly hoard manufacturing system in the embodiment.

In screen printing device 13 having the above described configuration, operation control of carry-in side delivering unit 22, operation control of transporter 44, operation control of clamp-device driver 45M, movement control of base part 42 by XYZ rotation stage 41, raising and lowering operation control of base part 42 by elevator mechanism 48, raising and lowering operation control of squeegee 33*k* by cylinder 38*s*, movement control of squeegee head 33 by head driving mechanism 33M and operation control of carry-out side delivering unit 24, are performed by control device 60 provided in screen printing device 13 (FIG. 5*b*). In addition, control device 60 also performs driving control of control valve 57 (refer to FIG. 3).

In FIG. 1, carryout side relay conveyor 14 is provided on the downstream process side of screen printing device 13. Carry-out side relay conveyor 14 receives the transport target carried out by carry-out side delivering unit 24 of screen printing device 13 from carry-out position P3 to the outside, and carries out the transport target to component placement, device 15 on the downstream process side.

In FIG. 1, component placement, device 15 transports board 2 sent from carry-out side relay conveyor 14 by board transport path 61, positions board 2 at working position Pw, and supports board 2 by board support unit 62 positioned below board transport, path 61. In addition, components (not-illustrated) are mounted on the electrode of board 2 to which the screen printing is performed in screen printing device 13, by mounting head 63.

In FIG. 1, undersupporting-device supplier 16 is provided on the upstream process side of screen printing device 13 being aligned with carrying side relay conveyor 12 in the Y-axis direction. Undersupporting-device supplier 16 supplies undersupporting device 47 which is installed on undersupporting-device installer 46 of screen printing device 13, as the transport target. In the embodiment, undersupporting-device supplier 16 supplies undersupporting device 47 which serves as the transport target, to receiving position P2 provided in screen printing device 13. In addition, when receiving undersupporting device 47 at receiving position P2, carry-in side delivering unit 22 moves to the transporter inlet, and delivers undersupporting device 47 to transporter 44. In this manner, in the embodiment, undersupporting-device supplier 16 supplies undersupporting device 47 which serves as the transport target to receiving position P2 that is different from receiving position P1 among the plurality of receiving positions provided in carry-in side delivering unit 22.

In FIG. 1, undersupporting-device collector 17 is provided on the downstream process side of screen printing device 13 being aligned with carry-out side relay conveyor 14 in the Y-axis direction. Undersupporting-device collector 17 receives and collects undersupporting device 47 which is installed on undersupporting-device installer 46 of screen printing device 13. In the embodiment, in a case where the transport target transported from transporter 44 is undersupporting device 47, carry-out side delivering unit 24 of screen printing device 13 carries out undersupporting device 47 to the downstream process side from carry-out position P4, and undersupporting-device collector 17 is provided at a position of receiving undersupporting device 47 carried out from carry-out position P4. Undersupporting-device collector 17 collects and accommodates undersupporting device 47 received from carry-out side delivering unit 24.

Figure 6A:
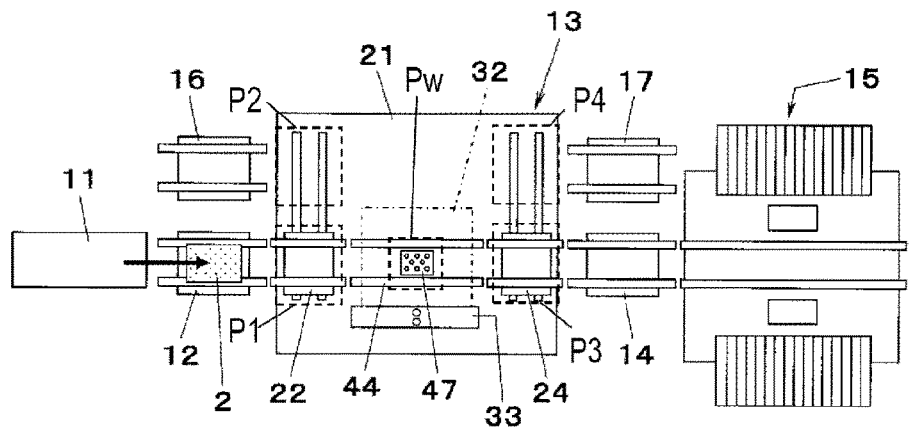
FIGS. 6A to 6C are views illustrating operations when screen printing work is performed by the assembly board manufacturing system in the embodiment.
Figure 6B:
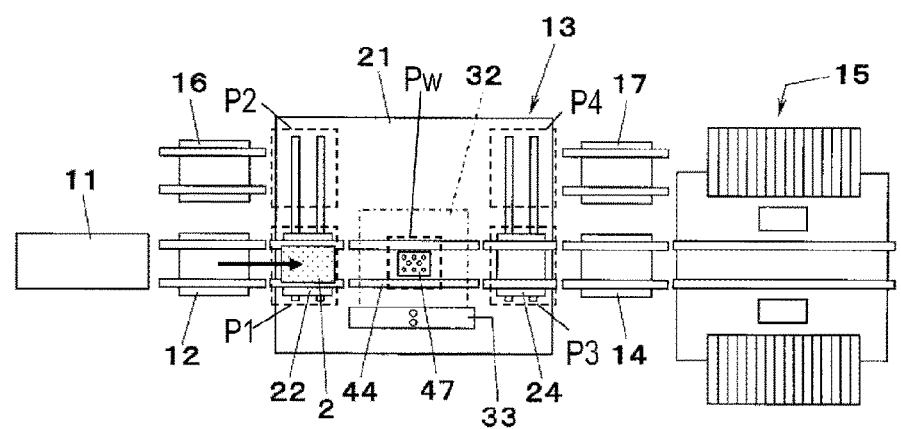
Figure 6C:
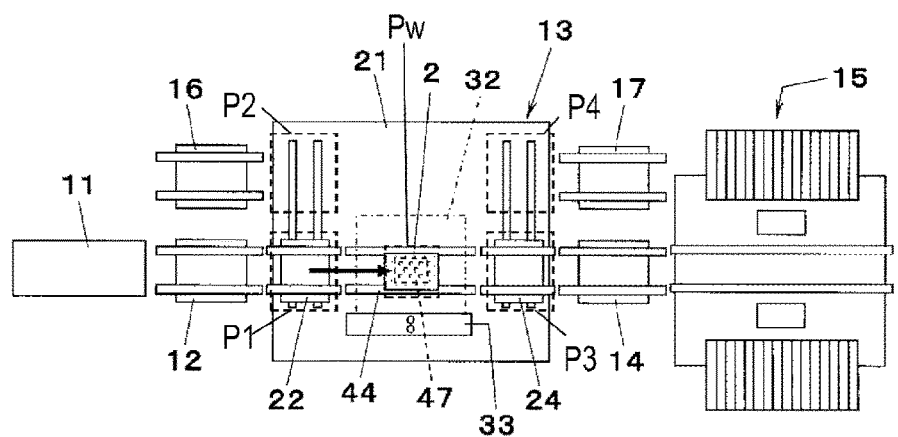
Figure 7A:
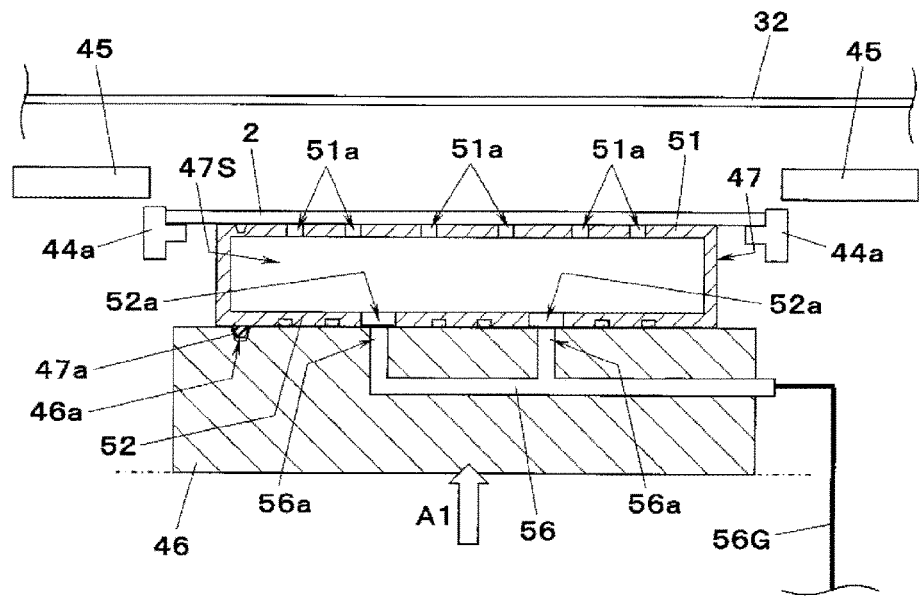
FIGS. 7A and 7B are views illustrating operations when the screen printing work is performed by the assembly board manufacturing system in the embodiment.

Next, an operation when manufacturing an assembly board by assembly board manufacturing system 1, will be described. In manufacturing the assembly board, first, board supplier 11 supplies board 2 to carry-in side relay conveyor 12 (FIG. 6A). Carry-in side relay conveyor 12 which receives board 2 from board supplier 11 delivers board 2 to carry-in side delivering unit 22 which is positioned in the transporter inlet (receiving position P1) in advance (FIG. 6B). Carry-in side delivering unit 22 which has received board 2 in the transporter inlet carries out board 2 to transporter 44 while maintaining a state thereof, and transporter 44 transports received board 2 to working position Pw (FIG. 6C). When board 2 is transported to working position Pw, elevator mechanism 48 raises under supporting-device installer 46 (arrow A1 illustrated in FIG. 7A), and the upper surface of undersupporting device 47 is brought into contact, with the lower surface of board 2 (FIG. 7A).

When the upper surface of undersupporting device 47 comes into contact with the lower surface of board 2, control device 60 operates control valve 57, and generates the suctioning force to suction hole 51a. Accordingly, board 2 tightly adheres to the upper surface of undersupporting device 47, and even in a case where deformation, such as a warp, is generated in board 2, board 2 is supported by undersupporting device 47 while the deformation is corrected.

Figure 7B:
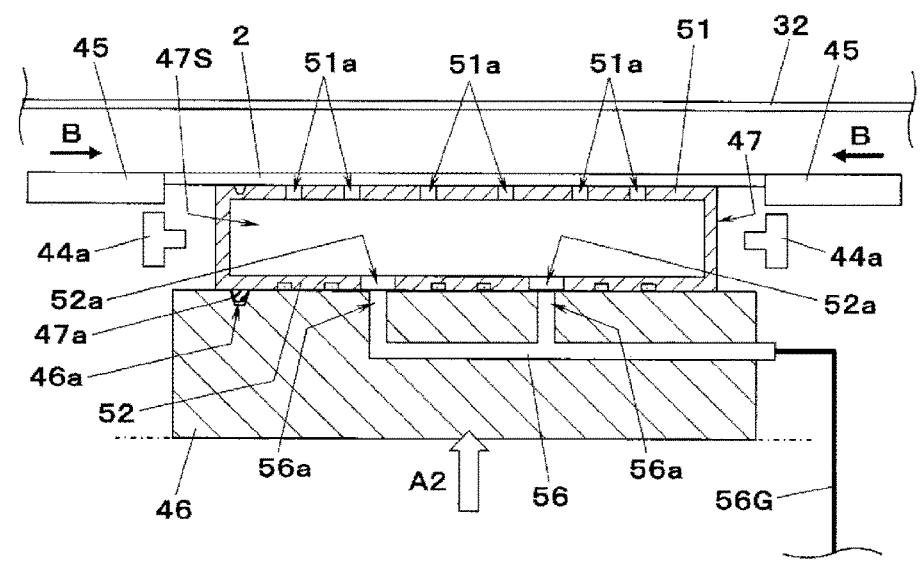

When board 2 is supported by undersupporting device 47, elevator mechanism 48 further raises undersupporting-device installer 46 (arrow A2 illustrated in FIG. 7B). Accordingly, board 2 is lifted up by undersupporting device 47, and is separated from transporter 44 (FIG. 7B). When board 2 is lifted up and the upper surface thereof is raised to have the same height as that, of the upper surface of one pair of clamp devices 45, one pair of clamp devices 45 driven by clamp-device driver 45M operates to approach each other, and clamps board 2 from both end sides in the Y-axis direction (arrow B illustrated in FIG. 7B).

Figure 8:
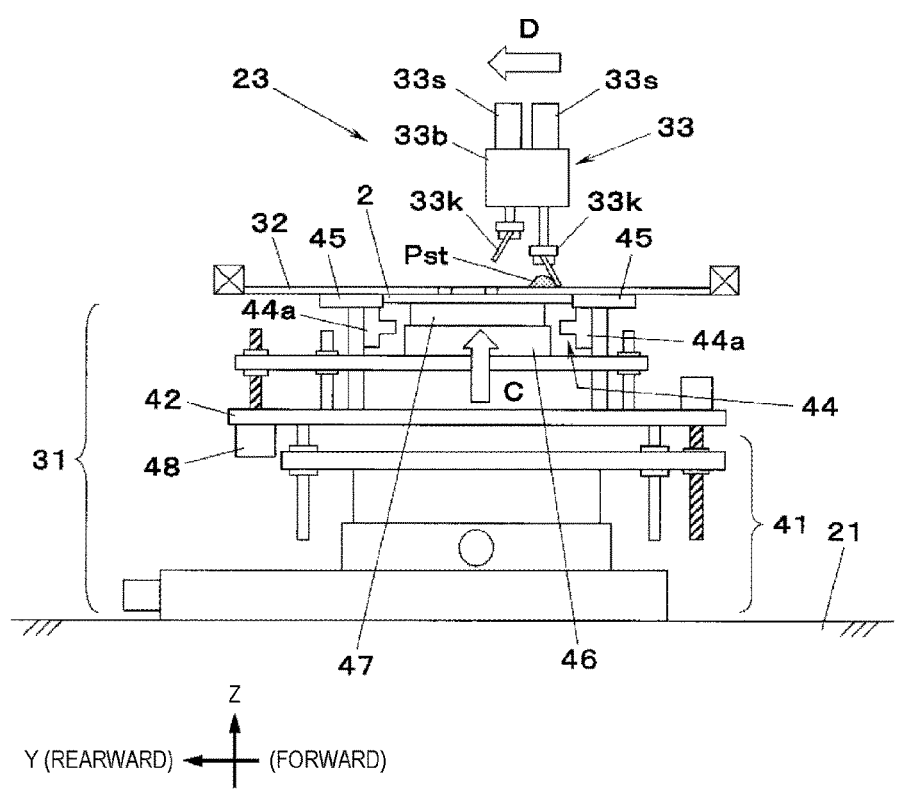
FIG. 8 is a view illustrating operations when the screen printing work is performed by the assembly board manufacturing system in the embodiment.
Figure 9A:
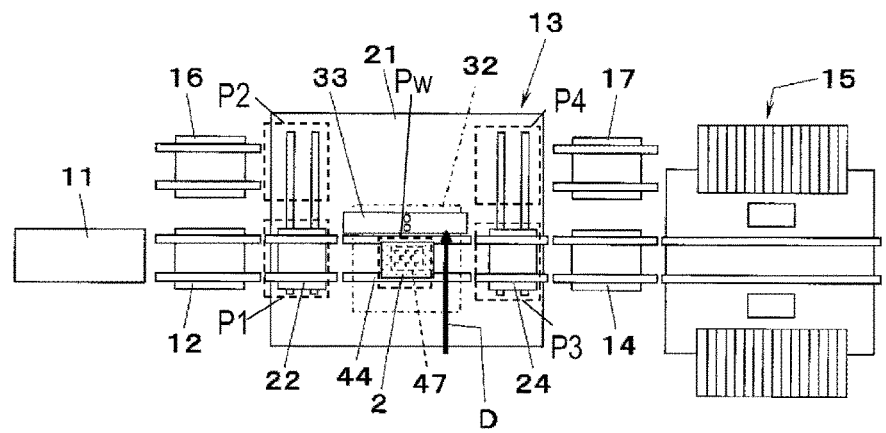
FIGS. 9A to 9C are views illustrating operations when the screen printing work is performed by the assembly board manufacturing system in the embodiment.

When one pair of clamp devices 45 clamps board 2, XYZ rotation stage 41 operates, board 2 is horizontally moved such that the pattern opening of mask 32 and the electrode of board 2 vertically match each other, and then, base part 42 is raised (arrow C illustrated in FIG. 8. Accordingly, when the upper surface of board 2 comes into contact with the lower surface of mask 32, squeegee head 33 lowers one squeegee 33k by cylinder 33s, and allows the lower end of squeegee 33k to abut against the upper surface of mask 32 (FIG. 8). When the lower end of squeegee 33k abuts against the upper surface of mask 32, head driving mechanism 33M operates, moves squeegee head 33 in the Y-axis direction (arrow D illustrated in FIGS. 8 and 9A), and slidely moves squeegee 33k on mask 32. Accordingly, paste Pst which has been supplied in advance onto mask 32 is scraped by squeegee 33k, and paste Pst is printed on the electrode of board 2 through the opening of mask 32.

Figure 9B:
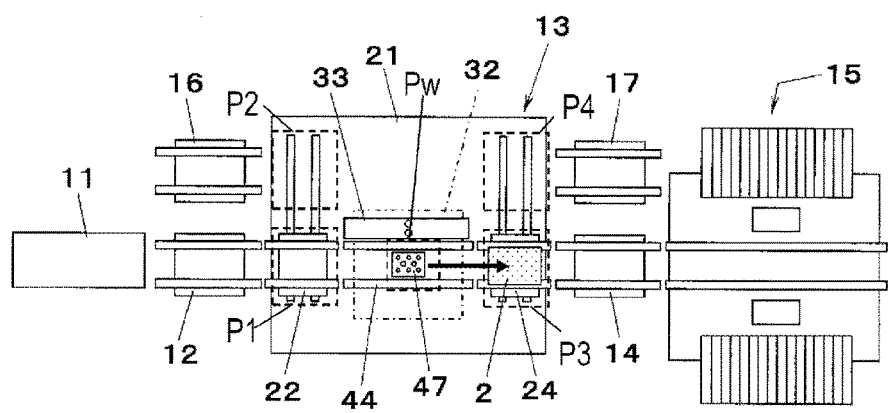
Figure 9C:
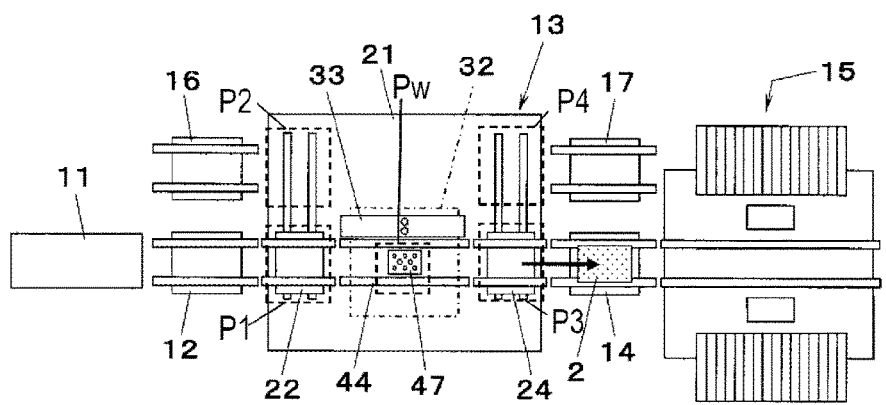

When paste Pst is printed on the electrode of board 2, XYZ rotation stage 41 operates, base part 42 is lowered, and board 2 is separated (plate releasing) from mask 32. When board 2 is separated from mask 32, control device 60 operates control, valve 57 and releases the suctioned state of board 2. When the suctioned, state of board 2 is released, one pair of clamp devices 45 operate in the direction in which clamp devices 45 are separated from each other and releases the clamp of board 2, and elevator mechanism 48 lowers undersupporting-device installer 46 and loads board 2 on transporter 44 (FIG. 3). When board 2 is loaded on transporter 44, transporter 44 transports board 2, and carries out board 2 to carry-out side delivering unit 24 which is positioned at the transporter outlet (carry-out position P3) in advance (FIG. 9B). Carry-out side delivering unit 24 receives board 2 (board 2 to which the screen printing is performed) carried out by transporter 44 at the transporter outlet, and carries out board 2 to carry-out side relay conveyor 14 while maintaining a state thereof (FIG. 9C). Accordingly, the screen printing for one board 2 is finished by screen printing device 13.

Carry-out side relay conveyor 14 carries out board 2 received from screen printing device 13 to component placement device 15. Component placement device 15 receives board 2 carried out by carry-out side relay conveyor 14, by board transport path 61, and positions board 2 at working position Pw and after board 2 is supported by board support unit 62, the components are mounted on board 2 by mounting head 63. In addition, when all of the components to be mounted on board 2 are mounted, board 2 is carried out to the outside (downstream process side).

In assembly board manufacturing system 1 having the configuration, installation and detachment, of undersupporting device 47 presided in screen printing device 13 can be respectively automatically performed, and the order thereof will be described hereinafter.

In a case of automatically installing undersupporting device 47 on undersupporting-device installer 46 of screen printing device 13, carrier 71. (FIGS. 10A and 10B) which is formed in a shape of a board, is used. A plurality of magnets (magnet 71M) are provided on the lower surface of carrier 71 to be exposed downward. As described above, since undersupporting device 47 is configured of a magnetic material, and magnet 71M pulls undersupporting device 47 by the magnetic force, when the upper surface of undersupporting device 47 comes into contact with the lower surface of carrier 71, and undersupporting device 47 is held by carrier 71. In this manner, in the embodiment, magnet 71M is provided on the lower surface of carrier 71, and undersupporting device 47 is held on the lower surface of carrier 71 by the magnetic force shown by magnet 71M.

Here, magnet 71M shows a pulling force which is weaker than the magnetic force by which magnet 47M provided in undersupporting device 47 pull undersupporting-device installer 46, and a magnetic force which pulls undersupporting device 47. In other words, the pulling force between undersupporting device 47 and carrier 75 is weaker than the pulling force between undersupporting device 47 and undersupporting-device installer 46.

Figure 10A:
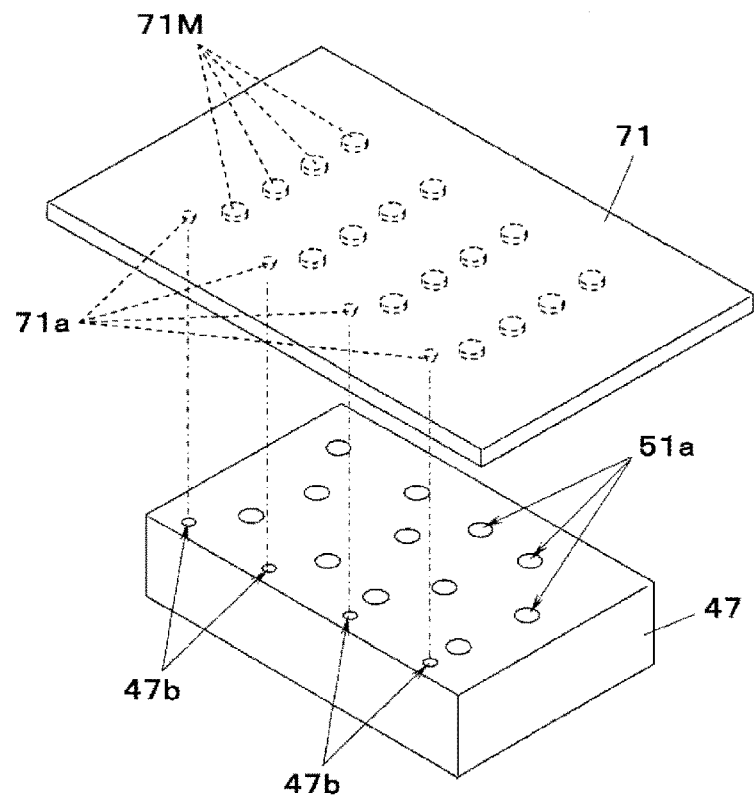
FIGS. 10A and 10B are perspective views illustrating the undersupporting device of the screen printing device provided in the assembly board manufacturing system in the embodiment, together with a carrier.
Figure 10B:
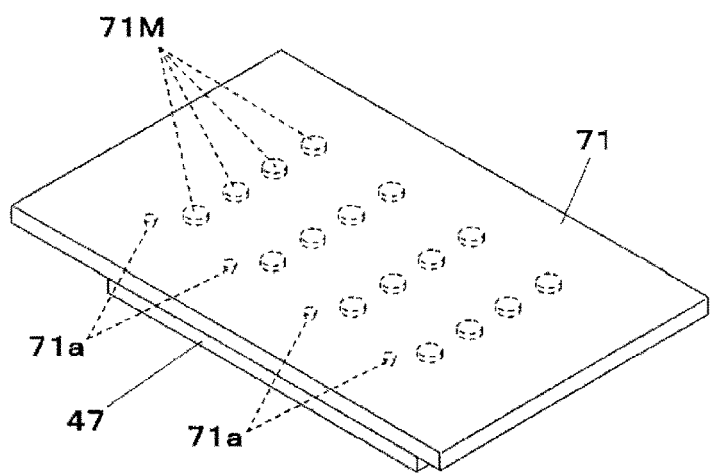

As illustrated in FIGS. 10A and 10B, a plurality of projections 71a which protrude downward are provided on the lower surface of carrier 71, and a plurality of holes 47b having a shape which can be fitted to each projection 71a are provided on the tipper surface of undersupporting device 47.

As the plurality of projections 71a of carrier 71 are fitted to the plurality of holes 47b of undersupporting device 47, undersupporting device 47 is accurately held at a predetermined holding position with respect to carrier 71.

Figure 11A:
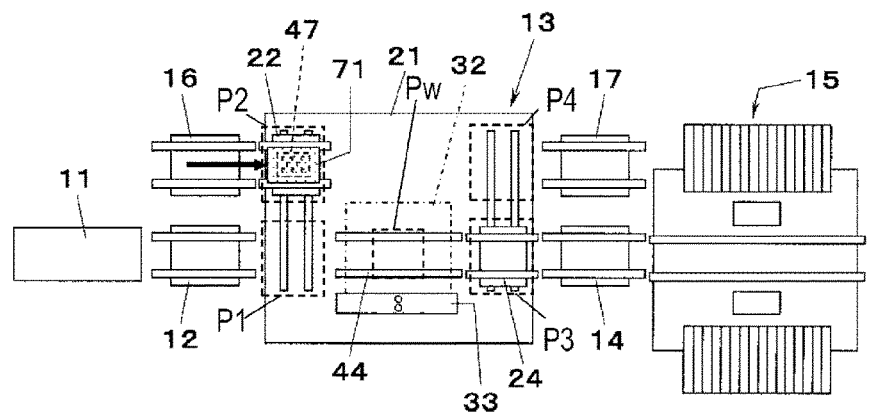
FIGS. 11A to 11C are views illustrating operations when installation work of the undersupporting device is performed by the assembly board manufacturing system in the embodiment.
Figure 11B:
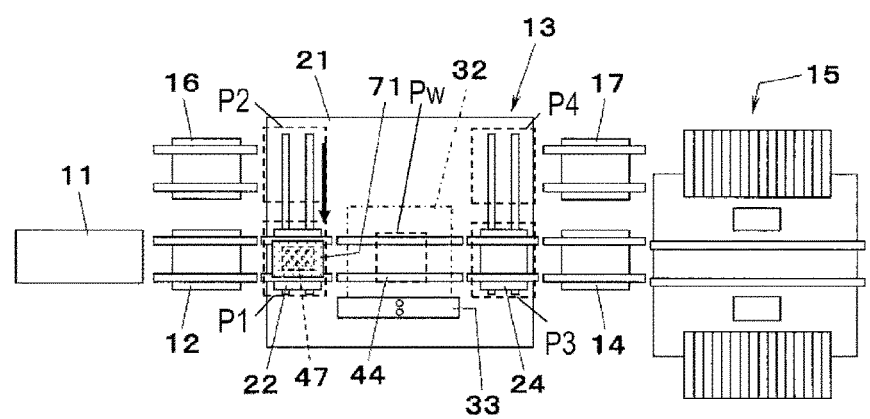
Figure 11C:
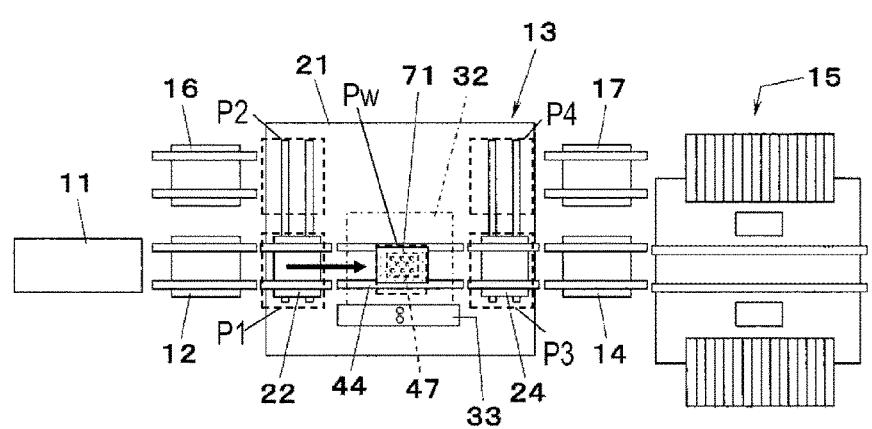

As described above-described, carrier 71 which holds undersupporting device 47 is set in undersupporting-device supplier 16 in advance, and undersupporting-device supplier 16 supplies undersupporting device 47 which serves, as the transport target to receiving position P2 different from receiving position P1 among the plurality of receiving positions provided in carry-in side delivering unit 22 (undersupporting device supplying process). Specifically, after positioning carry-in side delivering unit 22 at receiving position P2 in advance, carrier 71 which holds undersupporting device 47 is carried out to carry-in side delivering unit 22 from undersupporting-device supplier 16 (FIG. 11A). Carry-in side delivering unit 22 which receives carrier 71 that holds undersupporting device 47 from undersupporting-device supplier 16, moves to receiving position P1 from receiving position P2 (FIG. 11B). In addition, carry-in side delivering unit 22 delivers carrier 71 to transporter 44, and transporter 44 transports received carrier 71 to working position Pw (FIG. 11C). In other words, undersupporting device 47 supplied from receiving position P2 is transported to working position Pw by carry-in side delivering unit 22 and transporter 44 (undersupporting device transporting process).

Figure 12A:
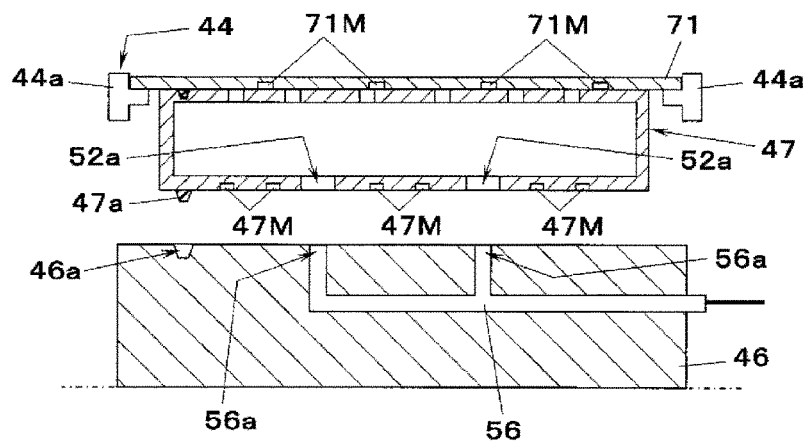
FIGS. 12A to 12C are views illustrating operations when the installation work of the undersupporting device is performed by the assembly board manufacturing system in the embodiment.
Figure 12B:
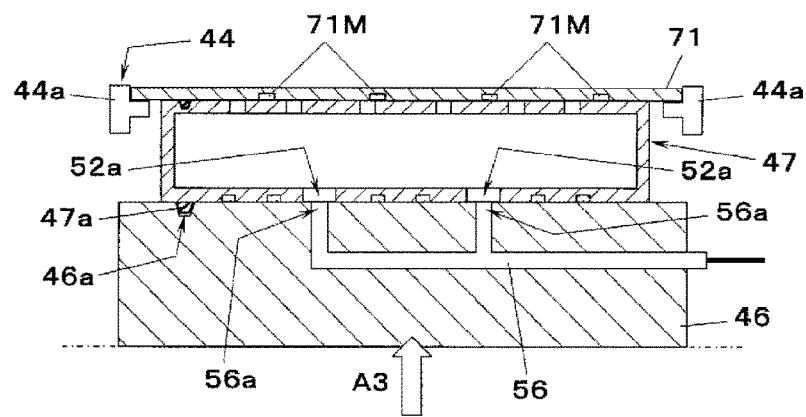

As transporter 44 transports carrier 71 to working position Pw, when undersupporting device 47 held by carrier 71 is positioned above undersupporting-device installer 46 (FIG. 12A), undersupporting device 47 positioned above undersupporting-device installer 46 is installed on undersupporting-device installer 46 (undersupporting device installing process). Specifically, first, as elevator mechanism 48 raises undersupporting-device installer 46 (arrow A3 illustrated in FIG. 12B) and brings the upper surface of undersupporting-device installer 46 into contact with the lower surface of undersupporting device 47, undersupporting device 47 held by carrier 71 is fixed to undersupporting-device installer 46 by the magnetic force between magnet 47M and undersupporting-device installer 46 (at this time, the plurality of recesses 46a on undersupporting-device installer 46 side is fitted to the plurality of projections 47a on undersupporting device 17 side). In this manner, when undersupporting device 47 is fixed to undersupporting-device installer 46, elevator mechanism 48 lowers undersupporting-device installer 46 (arrow A4 in FIG. 12C).

Figure 12C:
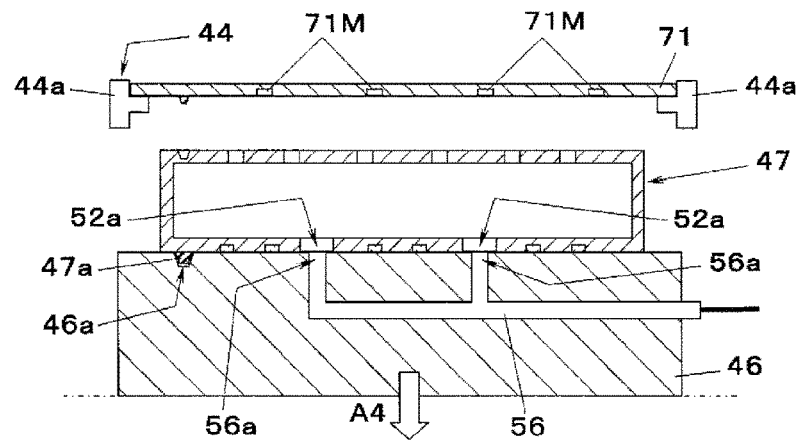

As described above, in the raising and lowering operation of undersupporting-device installer 46, when undersupporting-device installer 46 comes into contact with the lower surface of undersupporting device 47 held by carrier 71, undersupporting device 47 receives the pulling force between undersupporting device 47 and carrier 71 and the pulling force between undersupporting device 47 and undersupporting-device installer 46, but as described above, the pulling force between undersupporting device 47 and carrier 71 is weaker than the pulling force between undersupporting device 47 and undersupporting-device installer 46. Therefore, after this, when undersupporting-device installer 46 is lowered, undersupporting device 47 is separated from carrier 71 and is placed in a state of being installed on undersupporting-device installer 46 (FIG. 12C).

Figure 13A:
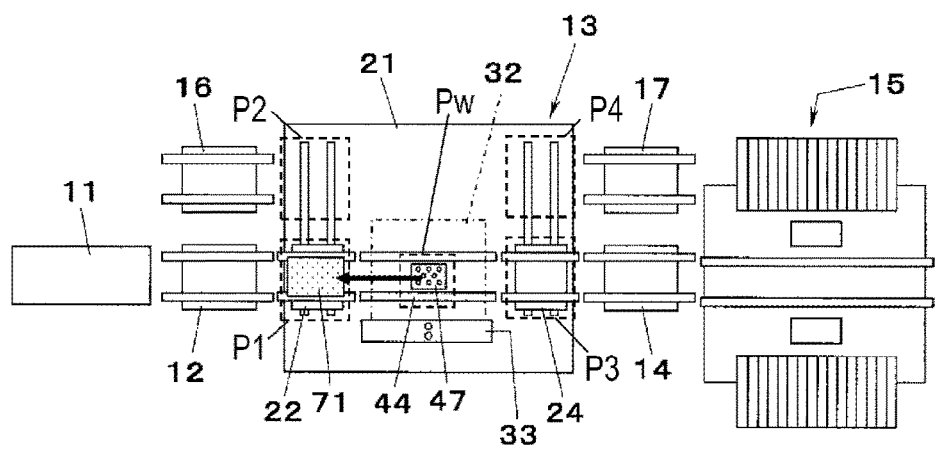
FIGS. 13A to 13C are views illustrating operations when the installation work of the undersupporting device is performed by the assembly board manufacturing system in the embodiment.
Figure 13B:
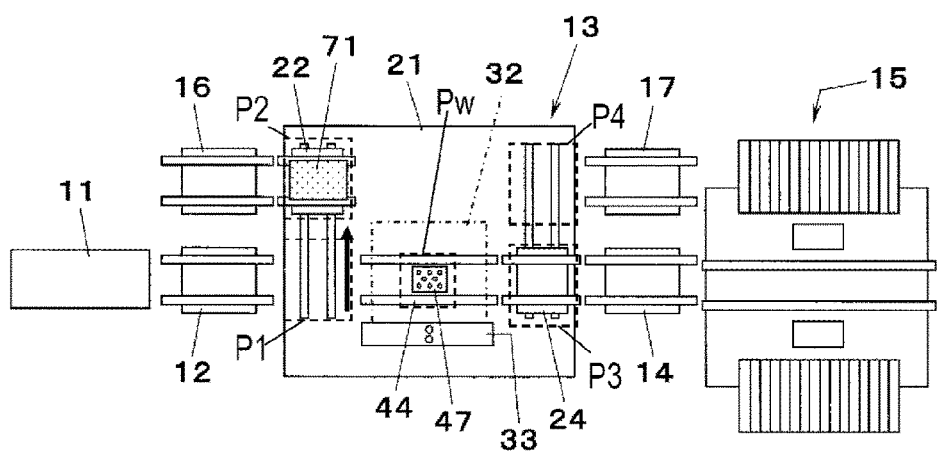
Figure 13C:
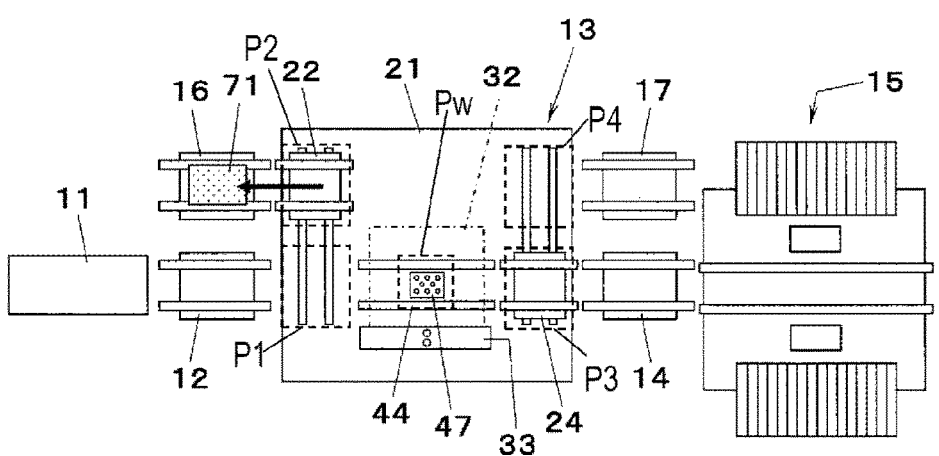

As described above, when undersupporting device 47 is installed on undersupporting-device installer 46, transporter 44 transports carrier 71 separated from undersupporting device 47 to a transporter inlet side, and delivers carrier 71 to carry-in side delivering unit 22 which is positioned at the transporter inlet (receiving position P1) in advance (FIG. 13A). In addition, carry-in side delivering unit 22 which has received carrier 71 moves to receiving position P2 from receiving position P1 (FIG. 13B), and carries out carrier 71 to undersupporting-device supplier 16. Undersupporting-device supplier 16 receives and collects carrier 71 (FIG. 13C). Accordingly, the installation of undersupporting device 47 on screen printing device 13 is completed.

Figure 14A:
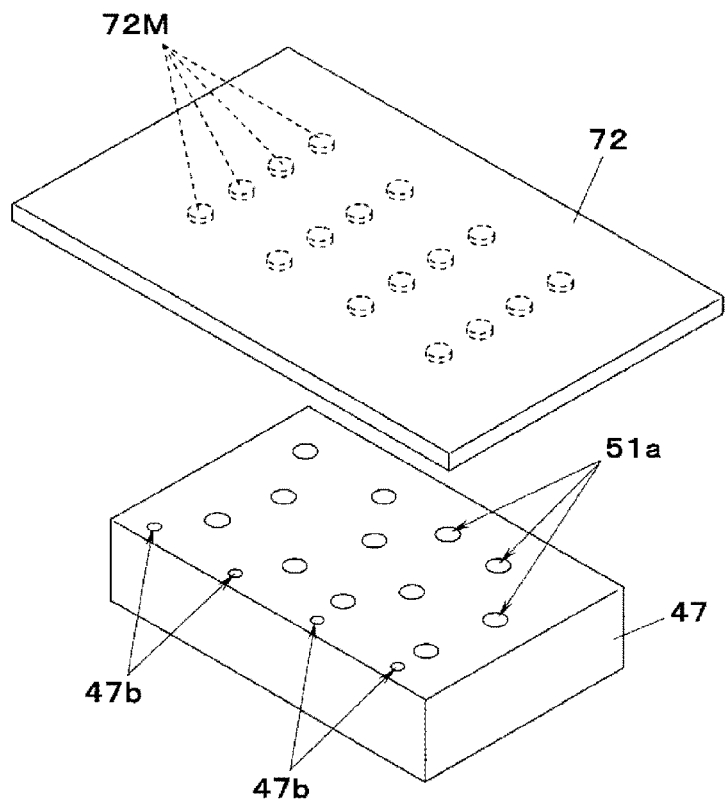
FIGS. 14A and 14B are perspective views illustrating the undersupporting device of the screen printing device provided in the assembly board manufacturing system in the embodiment, together with the carrier.
Figure 14B:
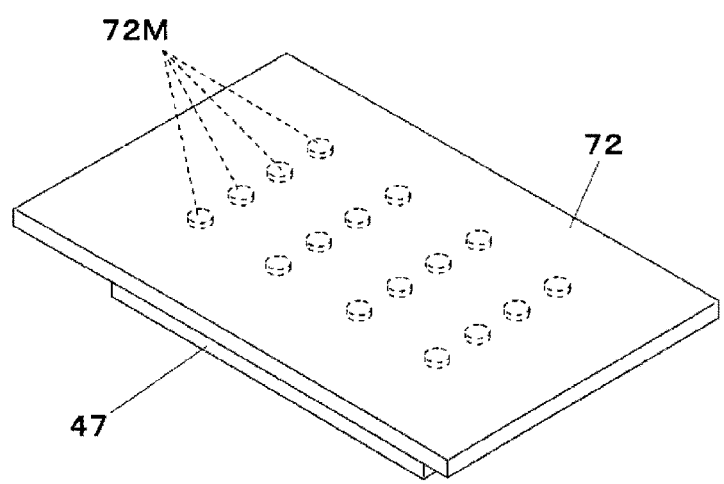

In a case of automatically collecting undersupporting device 47 installed on screen printing device 13, carrier 72 formed in a shape of a board is used (FIGS. 14A and 14B). In FIGS. 14A and 14B, a plurality of magnets (magnet 72M) are provided on the lower surface of carrier 72 to be exposed downward. As described above, since undersupporting device 47 is configured of a magnetic material, and magnet 72M pulls undersupporting device 47 by the magnetic force, when the upper surface of undersupporting device 47 comes into contact with the lower surface of carrier 72, and undersupporting device 47 can be held by carrier 72. In addition, magnet 72M provided in carrier 72 shows the pulling force which is stronger than the magnetic force by which magnet 47M provided in undersupporting device 47 pulls undersupporting-device installer 46. In other words, the pulling force between undersupporting device 47 and carrier 72 is stronger than the pulling force between undersupporting device 41 and undersupporting-device installer 46.

Figure 15A:
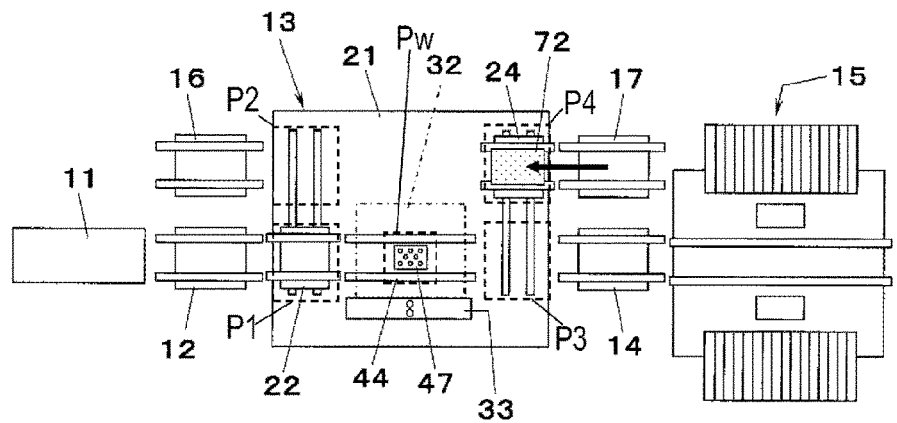
FIGS. 15A to 15C are views illustrating operations when collection work of the undersupporting device is performed by the assembly board manufacturing system in the embodiment.
Figure 15B:
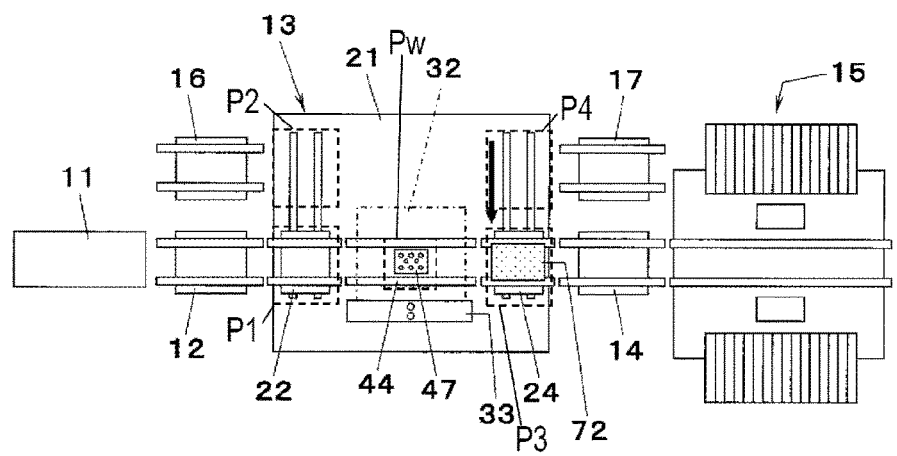
Figure 15C:
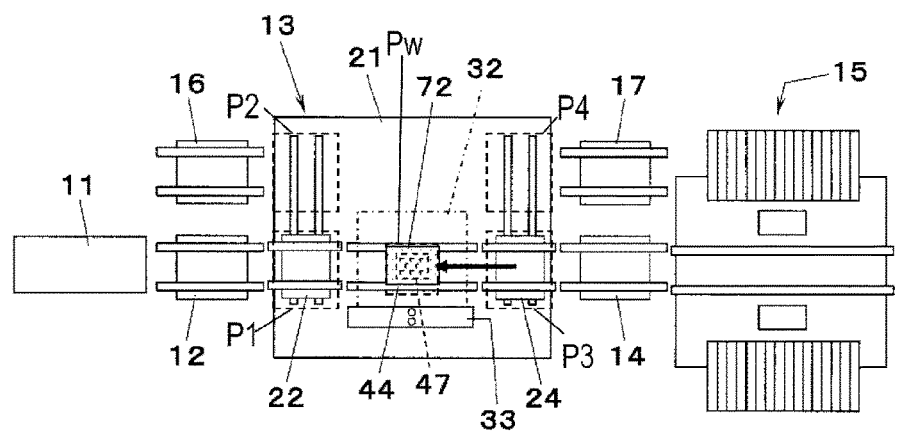

When carrier 72 is set in undersupporting-device collector 17, undersupporting-device collector 17 waits tor carry-out side delivering unit 24 to move to carry-out position P4, and carries out carrier 72 to carry-out side delivering unit 24 (FIG. 15A). Carry-out side delivering unit 24 which has received carrier 72 moves to carry-out position P3 from carry-out position P4 (FIG. 15B). In addition, carry-out side delivering unit 24 delivers carrier 72 to transporter 44 and transporter 44 transports received carrier 72 to working position Pw (FIG. 15C).

Figure 16A:
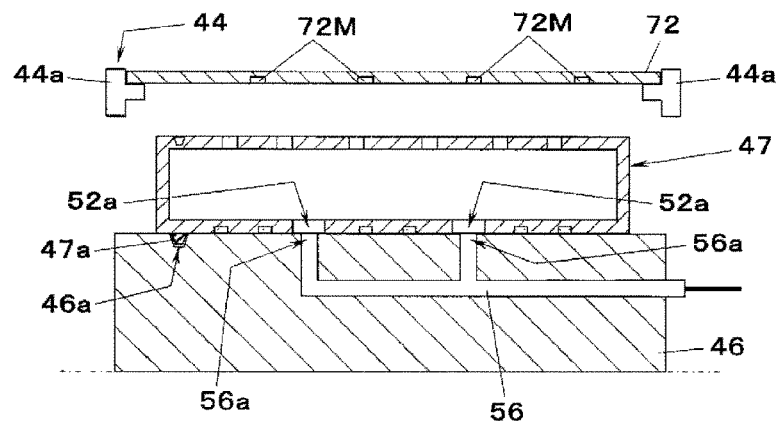
FIGS. 16A to 16C are views illustrating operations when the collection work of the undersupporting device is performed by the assembly board manufacturing system in the embodiment.
Figure 16B:
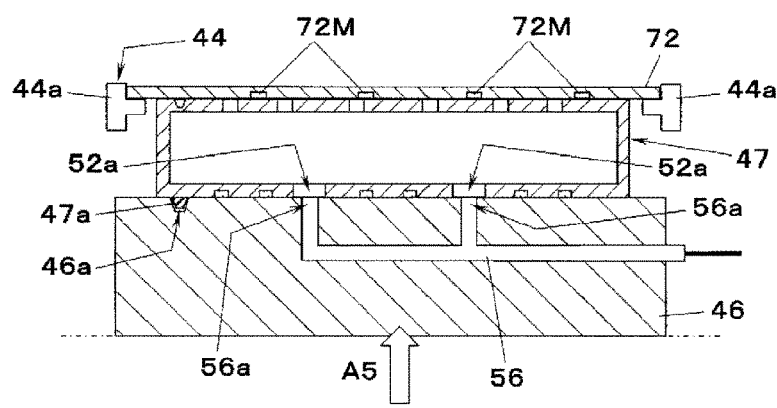

When carrier 72 is positioned above undersupporting device 47 installed on undersupporting-device installer 46 as transporter 44 transports carrier 72 to working position Pw (FIG. 16A), undersupporting device 47 installed on undersupporting-device installer 46 is detached from undersupporting-device installer 46 and is delivered to transporter 44 (undersupporting device detaching process). Specifically, first, as elevator mechanism 48 raises undersupporting-device installer (arrow A5 illustrated in FIG. 16B) and brings the upper surface of undersupporting device 47 into contact with the lower surface of carrier 72, undersupporting device 47 is held by carrier 72 by the magnetic force between magnet 72M and undersupporting device 47. In addition, when undersupporting device 47 is held by carrier 72 in this manner (FIG. 16B), elevator mechanism 48 lowers undersupporting-device installer 46 (arrow A6 illustrated in FIG. 16C).

Figure 16C:
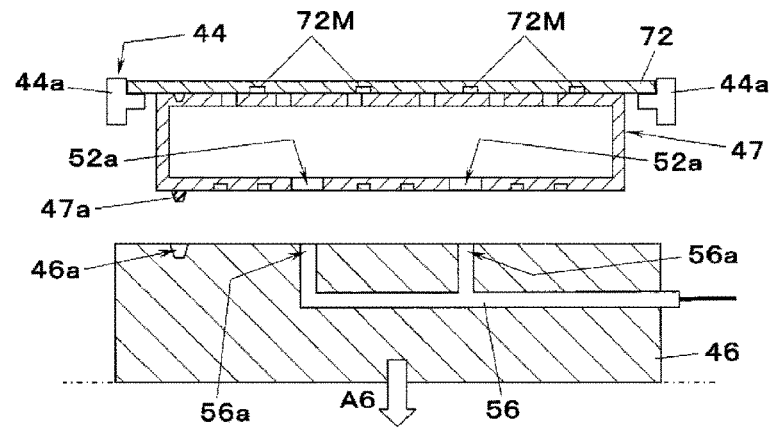

As described above, in the raising and lowering operation of undersupporting-device installer 46, when carrier 72 comes into contact with the upper surface of undersupporting device 47, undersupporting device 47 receives the pulling force between undersupporting device 47 and undersupporting-device installer 46 and the pulling force between undersupporting device 47 and carrier 72, but as described above, the pulling force between undersupporting device 47 and carrier 72 is stronger than the pulling force between undersupporting device 47 and undersupporting-device installer 46. Therefore, after this, when undersupporting-device installer 46 is lowered, undersupporting device 47 is separated from undersupporting-device installer 46, is delivered to carrier 72, and is placed in a state of being detached from undersupporting-device installer 46 (FIG. 16C).

Figure 17A:
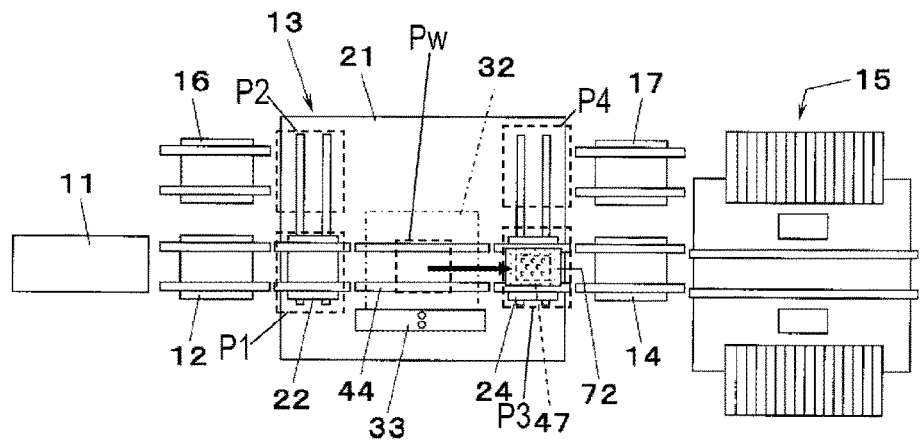
FIGS. 17A to 17C are views illustrating operations when the collection work of the undersupporting device is performed by the assembly board manufacturing system in the embodiment.
Figure 17B:
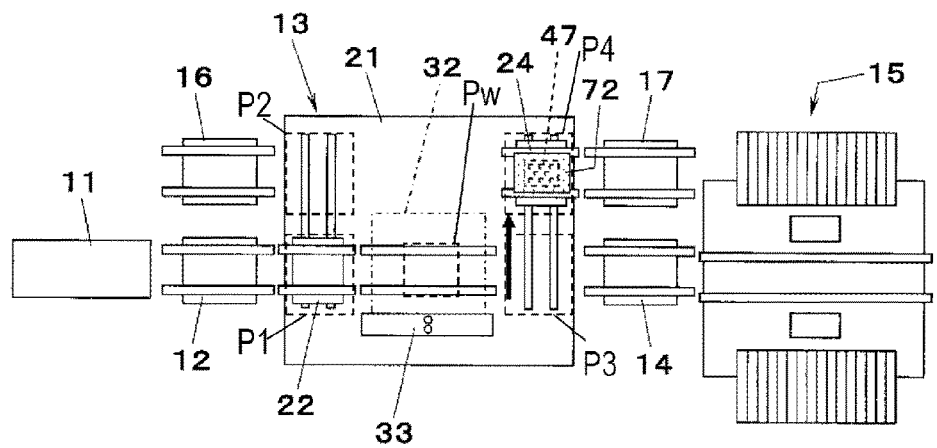
Figure 17C:
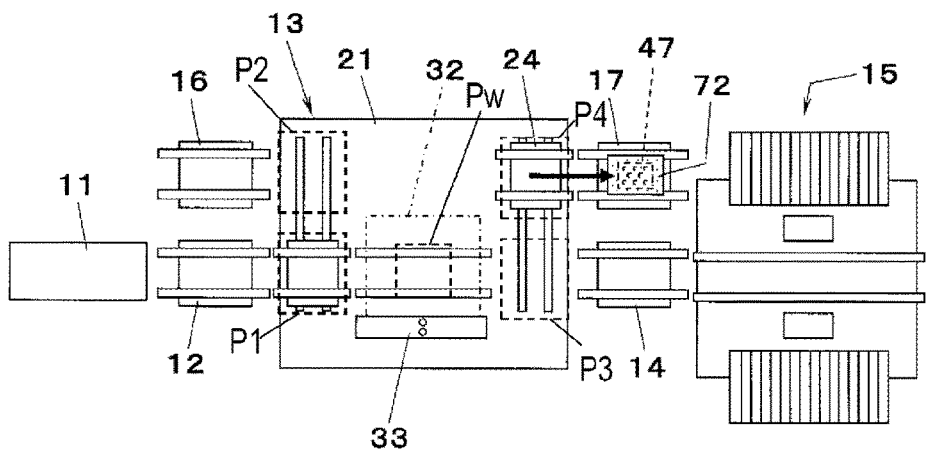

As described above, when undersupporting device 47 is delivered to carrier 72, transporter 44 delivers undersupporting device 47 to carry-out side delivering unit 24 (undersupporting device delivering process). Specifically, transporter 44 transports carrier 72 which holds undersupporting device 47 to the transporter outlet, side, and delivers carrier 72 to carry-out side delivering unit 24 which is positioned at the transporter outlet (carry-out position P3) in advance (FIG. 17A). In addition, carry-out side delivering unit 24 carries out undersupporting device 47 received from transporter 44, from carry-out position P4 (undersupporting device carrying out process). Specifically, after moving from carry-out position P3 to carry-out position P4 (FIG. 17B), carry-out side delivering unit 24 which has received carrier 72 carries out carrier 72 to undersupporting-device collector 17. In addition, undersupporting-device collector 17 receives and collects undersupporting device 47 together with carrier 72 (FIG. 17C). Accordingly, the collection of undersupporting device 47 from screen printing device 13 is completed.

In this manner, in the embodiment, carry-out side delivering unit 24 carrier out board 2 which serves as the transport target from carry-out position P3 among the plurality of carry-out positions, and carries out undersupporting device 47 which serves as the transport target from carry-out position P4 different from carry-out position P3 among the plurality of carry-out positions.

In addition, in the embodiment, undersupporting device 47 is supplied to receiving position P2 in a state of being held by the board-like lower surface of carrier 71, and carrier 71 is transported to working position Pw by being transported by carry-in side delivering unit 22 and transporter 44. In addition, undersupporting device 47 detached from undersupporting-device installer 46 and held by carrier 72 is carried out from carry-out position P4 by being transported by transporter 44 and carry-out side delivering unit 24.

According to the above-described order, it is possible to install undersupporting device 47 to screen printing device 13, and to collect undersupporting device 47 from screen printing device 13. However, after collecting undersupporting device 47, by continuously performing the installation work of undersupporting device 47, it is possible to automatically perform exchange work of undersupporting device 47 in the middle of producing the assembly boards.

As described above, in assembly board manufacturing system 1 (the installation method of the undersupporting device in assembly board manufacturing system 1) according to the embodiment, in a case where the transport, target is board 2, carry-in side delivering unit 22 which delivers the transport target to transporter 44, receives the transport target at receiving position P1, and delivers the transport target to transporter 44, and in a case where the transport target is undersupporting device 47, carry-in side delivering unit 22 receives the transport target at receiving position P2 different from receiving position P1, and delivers the transport target to transporter 44. Therefore, when installing undersupporting device 47, it is possible to supply undersupporting device 47 by a path different from that of board 2, and it is not necessary to stop (interrupt) the supply of board 2 from board supplier 11. Therefore, it is possible to perform the automatic installation of undersupporting device 47 without interruption of the supply of board 2 by board supplier 11.

In addition, in the above-described embodiment, by making the magnetic force (pulling force) act between undersupporting device 47 and undersupporting-device installer 46, undersupporting device 47 is installed on undersupporting-device installer 46. However, undersupporting device 47 may be installed on undersupporting-device installer 46 by means, other than the magnetic force. In addition, undersupporting device 47 is held on the lower surface of carrier 71 by the magnetic force shown by magnet 71M provided in carrier 71, but undersupporting device 47 may be held by carrier 71 by means, other than the magnetic force. In addition, similarly, undersupporting device 47 is held on the lower surface of carrier 72 by the magnetic force shown by magnet 72M provided in carrier 72, but undersupporting device 47 may be held by carrier 72 by means, other than the magnetic force.

In addition, in the above-described embodiment, a processing content with respect to board 2 is the screen printing work of printing paste Pst on board 2 by screen printing device 13, but may be another work, for example, component mounting work of mounting the components on board 2 by component placement device 15. In a case where the processing content with respect to board 2 is the component mounting work, component placement device 15 may be provided with carry-in side delivering unit 22 and carry-out side delivering unit 24 after replacing board transport path 61 provided in component placement device 15 illustrated in the above-described embodiment with transporter 44 in the above-described embodiment, replacing board support unit 62 with undersupporting device 47, and replacing screen printing device 13 with hoard supplier 11, and further, may be provided with an undersupporting-device collector (support unit collector which collects board support unit 62 on the downstream process side of component placement device 15.

As described above, transporter 44 is configured to transport board 2 and undersupporting device 47. Undersupporting-device installer 46 is provided below the transporter 44. Undersupporting-device installer 46 is attachable to and detachable from undersupporting device 47. Board processor (32, 33) is configured to perform a predetermined processing to an upper surface of board 2. Carry-in side delivering unit 22 has first receiving position P1 and second receiving position P2 different from first receiving position P1. Board supplier 11 is configured to supply board 2 to first receiving position P1. Undersupporting-device supplier 16 is configured to supply undersupporting device 47 to second receiving position P2. Carry-in side delivering unit 22 delivers, to transporter 44, undersupporting device 47 supplied to second receiving position P2. Transporter 44 transports, to working position Pw, undersupporting device 47 delivered from carry-in side delivering unit 22. Undersupporting-device installer 46 fixes, to undersupporting-device installer 46, undersupporting device 47 transported to working position Pw. Carry-in side delivering unit 22 delivers, to transporter 44, board 2 supplied to first receiving position P1. Transporter 44 transports, to working position Pw, board 2 delivered from carry-in side delivering unit 22. Undersupporting device 47 supports a lower surface of board 2 transported to working position Pw. Board processor (32, 33) performs the predetermined processing to the upper surface of board 2 while undersupporting device 47 is fixed to undersupporting-device installer 46 and supports the lower surface of board 2.

The system may further include carry-out side delivering unit 24 having first carry-out position P3 and second carry-out position P4 different from first carry-out position P3. In this case, transporter 44 delivers board 2 and undersupporting device 47 from working position Pw to carry-out side delivering unit 24. Carry-out side delivering unit 24 is configured to carry out, from first carry-out position P3, board 2 delivered from transporter 44. Carry-out side delivering unit 24 is configured to carry out, from second carry-out position P4, undersupporting device 47 delivered from the transporter 44.

The system may further include carrier 71 configured to hold undersupporting device 47. In this case, undersupporting-device supplier 16 supplies carrier 71 to second receiving position P2 while carrier 71 holds undersupporting device 47 on a lower surface of carrier 71. Carry-in side delivering unit 22 delivers, to transporter 44, carrier 71 supplied to second receiving position P2 while undersupporting device 47 is held on the lower surface of carrier 71. Transporter 44 transports undersupporting device 47 to working position Pw by transporting, to working position Pw, carrier 71 delivered from carry-in side delivering unit 22 while undersupporting device 47 is held on the lower surface of carrier 71.

The system may further include magnet 47M provided on a lower surface of undersupporting device 47. In this case, undersupporting device 47 is fixed to undersupporting-device installer 46 with a magnetic force of magnet 47M.

The system may further include magnet 71M provided on a lower surface of carrier 71. In this case, undersupporting device 47 is held on the lower surface of carrier 71 by a magnetic force of magnet 71M.

The system may further include elevator mechanism 48 configured to raise and lower undersupporting-device installer 46. In this case, elevator mechanism 48 is configured to fix undersupporting device 47 held by carrier 71 to undersupporting-device installer 46 by raising undersupporting-device installer 46. Elevator mechanism 48 is configured to install, undersupporting device 47 to undersupporting-device installer 46 by lowering undersupporting-device installer 46 while undersupporting device 47 is fixed to undersupporting-device installer 46.

The system may further include magnet 47M provided on a lower surface of undersupporting device 47. In this case, undersupporting device 47 is fixed to undersupporting-device installer 46 by a magnetic force of magnet 47M.

Elevator mechanism 48 may be configured to cause carrier 71 to hold undersupporting device 47 by raising undersupporting-device installer 46. In this case, elevator mechanism 48 is configured to detach undersupporting device 47 from undersupporting-device installer 46 by lowering undersupporting-device installer 46 while carrier 71 holds undersupporting device 47.

The system may further include carry-out side delivering unit 24 having first carry-out position P3 and second carry-out position P4 different from first carry-out position P3. In this case, transporter 44 delivers board 2 from working position Pw to carry-out side delivering unit 24. Transporter 44 delivers undersupporting device 47 to carry-out side delivering unit 24 while carrier 71 holds undersupporting device 47. Carry-out side delivering unit 24 is configured to carry out, from first carry-out position P3, board 2 delivered from transporter 44. Carry-out side delivering unit 24 is configured to carry out, from second carry-out position P4, undersupporting device 47 delivered from transporter 44 while carrier 71 holds undersupporting device 47.

Undersupporting device 47 may suction the lower surface of board 2 while supporting the lower surface of board 2 transported to working position Pw by transporter 44.

One of the undersupporting device 47 and the undersupporting-device installer 46 may have projection 47a in this case, another of the undersupporting device 47 and undersupporting-device installer 46 has recess 46a provided therein. Undersupporting device 47 is installed to undersupporting-device installer 16 while projection 47a is fitted into recess 46a.

Undersupporting device 47 is supplied to second receiving position P2, undersupporting device 47 supplied to the second receiving position P2 is delivered from carry-in side delivering unit 22 to transporter 44. Transporter 44 transports undersupporting device 47 delivered from carry-in side delivering unit 22 to working position Pw, By this method, undersupporting device 47 is installed to the system for manufacturing an assembly board.

What is claimed is:

1. A system for manufacturing an assembly board, the system comprising:

an undersupporting device comprising a hollow box with a top board having an upper surface with at least one suction hole therein;

a transporter a first carrier configured to hold the undersupporting device; having a pair of conveyors, the transporter configured to transport a board and the undersupporting device;

an undersupporting-device installer provided below the transporter, the undersupporting-device installer having an upper surface and made of a magnetic material that is attachable to and detachable from a bottom surface of the undersupporting device;

a board processor configured to perform a predetermined processing to an upper surface of the board;

a first receiving position and a second receiving position different from the first receiving position, wherein the board is supplied to the first receiving position, and wherein the undersupporting device is supplied to the second receiving position;

a working position at which the board processor performs the predetermined processing to the upper surface of the board, wherein the transporter is configured to deliver the board and the undersupporting device to the working position wherein the undersupporting device is delivered to the working position by transporting the first carrier while the carrier holds the undersupporting device on a lower surface of the first carrier wherein when the board and the undersupporting device are positioned at the working position, the upper surface of the undersupporting device supports a lower surface of the board the board processor performs the predetermined processing to the upper surface of the board, and the undersupporting device is fixed to the undersupporting-device installer.

2. The system of claim 1, further comprising a first carry-out position and a second carry-out position different from the first carry-out position, wherein the transporter delivers the board and the undersupporting device from the working position, and wherein the board is delivered to the first carry-out position; and the undersupporting device is delivered to the second carry-out position.

3. The system of claim 1, further comprising a second carrier for detaching the undersupporting device from the undersupporting device installer, wherein the first carrier and second carrier are configured to hold the undersupporting device, wherein the first carrier is supplied to the second receiving position while the first carrier holds the undersupporting device on a lower surface of the first carrier.

4. The system of claim 3, further comprising
a magnet provided on a lower surface of the undersupporting device,
wherein the undersupporting device is fixed to the undersupporting-device installer with a magnetic force of the magnet.

5. The system of claim 3, further comprising
a first magnet provided on the lower surface of the first carrier, and a second magnet provided on a lower surface of the second carrier,
wherein the undersupporting device is held on the lower surface of the first carrier and second carrier by a magnetic force of the first and second magnets, respectively.

6. The system of claim 3, further comprising
an elevator mechanism configured to raise and lower the undersupporting-device installer,
wherein the elevator mechanism is configured to:
fix the undersupporting device held by the first carrier to the undersupporting-device installer by raising the undersupporting-device installer; and
install the undersupporting device to the undersupporting-device installer by lowering the undersupporting-device installer while the undersupporting device is fixed to the undersupporting-device installer.

7. The system of claim 6, further comprising
a magnet provided on a lower surface of the undersupporting device,
wherein the undersupporting device is fixed to the undersupporting-device installer by a magnetic force of the magnet.

8. The system of claim 6, wherein the elevator mechanism is configured to:
cause the second carrier to hold the undersupporting device by raising the undersupporting-device installer; and
detach the undersupporting device from the undersupporting-device installer by lowering the undersupporting-device installer while the second carrier holds the undersupporting device.

9. The system of claim 8, further comprising
a first carry-out position and a second carry-out position different from the first carry-out position,
wherein the transporter delivers the board from the working position,
wherein the transporter delivers the undersupporting device while the second carrier holds the undersupporting device, and
wherein the board is delivered to the first carry-out position, and
the undersupporting device is delivered to the second carry-out position while the second carrier holds the undersupporting device.

10. The system of claim 1, wherein the undersupporting device suctions the lower surface of the board while supporting the lower surface of the board transported to the working position by the transporter.

11. The system of claim 1,
wherein one of the undersupporting device and the undersupporting-device installer has a projection,
wherein another of the undersupporting device and the undersupporting-device installer has a recess provided therein, and
wherein the undersupporting device is installed to the undersupporting-device installer while the projection is fitted into the recess.

12. A method of installing an undersupporting device to a system for manufacturing an assembly board, the method comprising:
providing a system for manufacturing an assembly board, the system including
an undersupporting device comprising a hollow box with a top board and having an upper surface and a lower surface a carrier configured to hold the undersupporting device,
an undersupporting-device installer having an upper surface and made of a magnetic material attachable to and detachable from the lower surface of the undersupporting device, and
a board processor configured to perform a predetermined processing to an upper surface of the board,
the method further comprising supplying the board to a first receiving position,
supplying the undersupporting device to a second receiving position,
delivering the undersupporting device from the second receiving position to a transporter,
transporting the undersupporting device to a working position by transporting the carrier while the carrier holds the undersupporting device on a lower surface of the carrier, and
performing a predetermined processing to an upper surface of the board while the undersupporting device is fixed to the undersupporting-device installer and the upper surface of the undersupporting device supports a lower surface of the board.

* * * * *